(12) United States Patent
Oh et al.

(10) Patent No.: US 9,024,323 B2
(45) Date of Patent: May 5, 2015

(54) ARRAY SUBSTRATE AND METHOD OF FABRICATING THE SAME

(75) Inventors: Hwa Yeul Oh, Seoul (KR); Osung Seo, Seoul (KR); Jeanho Song, Yongin-si (KR); Hyoung Cheol Lee, Suwon-si (KR); Taekyung Yim, Seoul (KR)

(73) Assignee: Samsung Display Co., Ltd. (KR)

( * ) Notice: Subject to any disclaimer, the term of this patent is extended or adjusted under 35 U.S.C. 154(b) by 129 days.

(21) Appl. No.: 13/599,945

(22) Filed: Aug. 30, 2012

(65) Prior Publication Data

US 2013/0256668 A1    Oct. 3, 2013

(30) Foreign Application Priority Data

Mar. 29, 2012   (KR) .................. 10-2012-0032512

(51) Int. Cl.
| | | |
|---|---|---|
| *H01L 29/04* | (2006.01) | |
| *H01L 29/66* | (2006.01) | |
| *H01L 29/786* | (2006.01) | |

(52) U.S. Cl.
CPC .... *H01L 29/66757* (2013.01); *H01L 29/78633* (2013.01)

(58) Field of Classification Search
USPC ............... 257/72, E27.111, E21.413, 413, 71
See application file for complete search history.

(56) References Cited

U.S. PATENT DOCUMENTS

| | | | | |
|---|---|---|---|---|
| 7,723,734 | B2 | 5/2010 | Cheng | |
| 8,071,985 | B2 * | 12/2011 | Sakurai et al. | 257/72 |
| 8,766,337 | B2 * | 7/2014 | Aichi | 257/290 |
| 2011/0090438 | A1 | 4/2011 | Lee | |
| 2011/0236604 | A1 | 9/2011 | Fujiwara et al. | |

FOREIGN PATENT DOCUMENTS

| | | |
|---|---|---|
| JP | 2003098515 | 4/2003 |
| JP | 2004347779 | 12/2004 |
| JP | 2005085976 | 3/2005 |
| JP | 2005258470 | 9/2005 |
| JP | 2005-285976 | 10/2005 |
| KR | 1019990024917 | 4/1999 |
| KR | 1020040057688 | 7/2004 |
| KR | 1020070052105 | 5/2007 |
| KR | 1020080043417 | 5/2008 |

* cited by examiner

*Primary Examiner* — Michael Shingleton
(74) *Attorney, Agent, or Firm* — Innovation Counsel LLP

(57) ABSTRACT

Provided is an array substrate including a base substrate, a thin film transistor having a semiconductor layer disposed on a first part of the base substrate. The semiconductor layer includes a source electrode and a drain electrode, a gate electrode disposed on the semiconductor layer and insulated from the semiconductor layer. A light-blocking layer disposed between the base substrate and the thin film transistor. The light-blocking layer comprises a first layer continuously disposed on and around the first part of the base substrate, and a second layer formed on the first part of the base substrate without extending outside of the first part, the second layer being disposed on the first layer.

10 Claims, 11 Drawing Sheets

ARRAY SUBSTRATE AND METHOD OF FABRICATING THE SAME

CROSS-REFERENCE TO RELATED APPLICATIONS

This U.S. non-provisional patent application claims priority under 35 U.S.C. §119 of Korean Patent Applications No. 10-2012-0032512, filed on Mar. 29, 2012, the entire content of which is herein incorporated by reference.

BACKGROUND

Embodiments of the present disclosure herein relate generally to an array substrate and a method of fabricating the same, and more particularly, to an array substrate able to prevent photo leakage currents of a thin film transistor and a method of fabricating the same.

Recently, according to a rapid advancement toward an information society, a display device having excellent characteristics, such as thin profile, lightweight and low power consumption, has been attracting attention. Accordingly, active matrix display devices including thin film transistors on a substrate have been developed.

The thin film transistor is generally disposed on a transparent substrate and includes an active layer between a source electrode and a drain electrode. The active layer includes a channel region for charge transfer. The active layer is generally formed of amorphous silicon or polysilicon. The channel region of the active layer generates unwanted photo leakage currents when light is incident thereon. Therefore, "off" current characteristics of the thin film transistor may be degraded.

SUMMARY

Embodiments of the present disclosures provide an array substrate capable of prevent a photo leakage currents of a thin film transistor.

Embodiments of the present disclosures also provide a method of fabricating the array substrate.

Embodiments of the inventive concept provide array substrates including: a base substrate; a thin film transistor disposed on a first part of the base substrate, wherein the semiconductor layer includes a source electrode and a drain electrode; a gate electrode disposed on the semiconductor layer and insulated from the semiconductor layer; and a light-blocking layer disposed between the base substrate and the thin film transistor. The light-blocking layer may include a first layer continuously disposed on and around the first part of the base substrate and a second layer disposed on the first layer.

In some embodiments, the second layer may include any one of $SiN_x$ ($x \geq 1$), $MoN_x$ ($x \geq 1$), $MoO_x$ ($x \geq 1$), $TiN_x$ ($x \geq 1$), and SiGe.

In other embodiments, the array substrate may further include a third layer disposed on the first part of the base substrate between the second layer and the semiconductor layer.

In still other embodiments, the third layer may include the same material as that of one of the first layer and the second layer.

In other embodiments of the inventive concept, methods of fabricating an array substrate include: forming a light-blocking layer on a base substrate, the light-blocking layer including a first layer configured to transmit light and a second layer configured to block light; depositing and crystallizing amorphous silicon on the light-blocking layer to form a silicon layer; simultaneously patterning the second layer and the silicon layer without patterning the first layer by using a single mask to form a patterned second layer and a semiconductor layer; forming a gate electrode layer on the semiconductor layer; forming a source electrode and a drain electrode to be insulated from the gate electrode; and forming a pixel electrode in contact with the drain electrode.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Hereinafter, embodiments of the inventive concept will be described in more detail with reference to the accompanying drawings.

Figure 1:
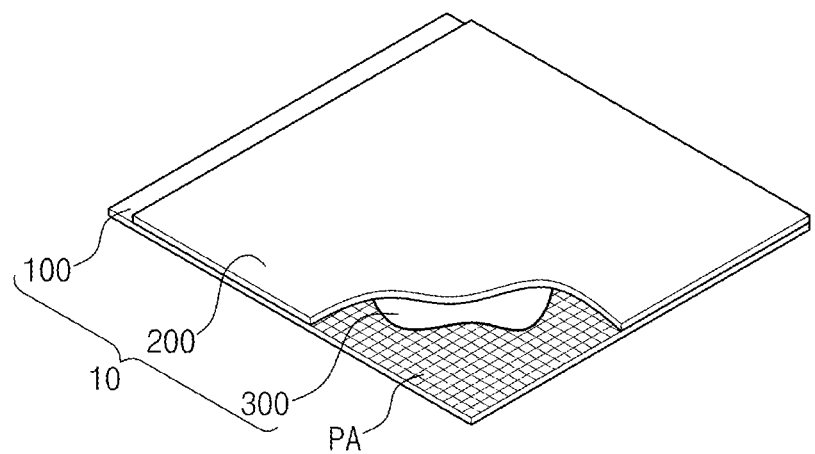
FIG. 1 is a perspective view illustrating a display device according to an embodiment of the inventive concept.

FIG. 1 is a perspective view illustrating a display device according to an embodiment of the inventive concept.

Referring to FIG. 1, the display device according to the embodiment of the inventive concept at least includes a display panel 10.

The display panel 10 is an active matrix display panel including various types of display panels. For example, any one of an organic light emitting display (OLED) panel, a liquid crystal display (LCD) panel, an electrophoretic display (EPD) panel, and an electrowetting display (EWD) panel may be used as the display panel 10. When non-emissive display panels, such as the liquid crystal display panel, the electrophoretic display panel, and the electrowetting display panel, are used as the display panel 10, the display device may include a back-light unit (not shown) providing light to the display panel 10. In the present embodiment, the liquid crystal display is described as an example of the display panel 10.

The display panel 10 has a rectangular shape having a long side and a short side, and displays an image in a display area. Also, the display panel 10 includes an array substrate 100, a facing substrate 200 facing the array substrate 100, and a liquid crystal layer 300 disposed between the array substrate 100 and the opposite substrate 200.

The array substrate 100 includes a plurality of pixel areas PAs arranged in a matrix form. Each pixel area PA includes a thin film transistor (not shown) electrically connected to a gate line (not shown) and a data line (not shown). The thin film transistor is electrically connected to a pixel electrode and provides a driving signal transferred from the data line to the pixel electrode.

Further, a driver IC (not shown) may be disposed adjacent to at least one side of the array substrate 100. The driver IC receives various signals from the outside and outputs the driving signal driving the display panel 10 in response to various input control signals to the thin film transistor.

The opposite substrate 200 may include color filters (not shown) having predetermined colors and a common electrode (not shown) formed on the color filters to face the pixel electrode. Herein, the color filters may be formed through a thin film process. Meanwhile, color filters being disposed on the opposite substrate 200 were described as an example in the inventive concept, but the inventive concept is not limited thereto. For example, the color filters may be disposed on the array substrate 100.

The liquid crystal layer 300 is arranged in a predetermined direction by a voltage applied between the pixel electrode and the common electrode to adjust transmittance of the light provided from the back-light unit, and thus, allows the display panel 10 to be able to display an image.

At least one of the array substrate 100 and the opposite substrate 200 may further include a black matrix (not shown) disposed on a region between each pixel. The black matrix may improve contrast of the display panel 10 by preventing interference of light transmitted through the each pixel.

Figure 2:
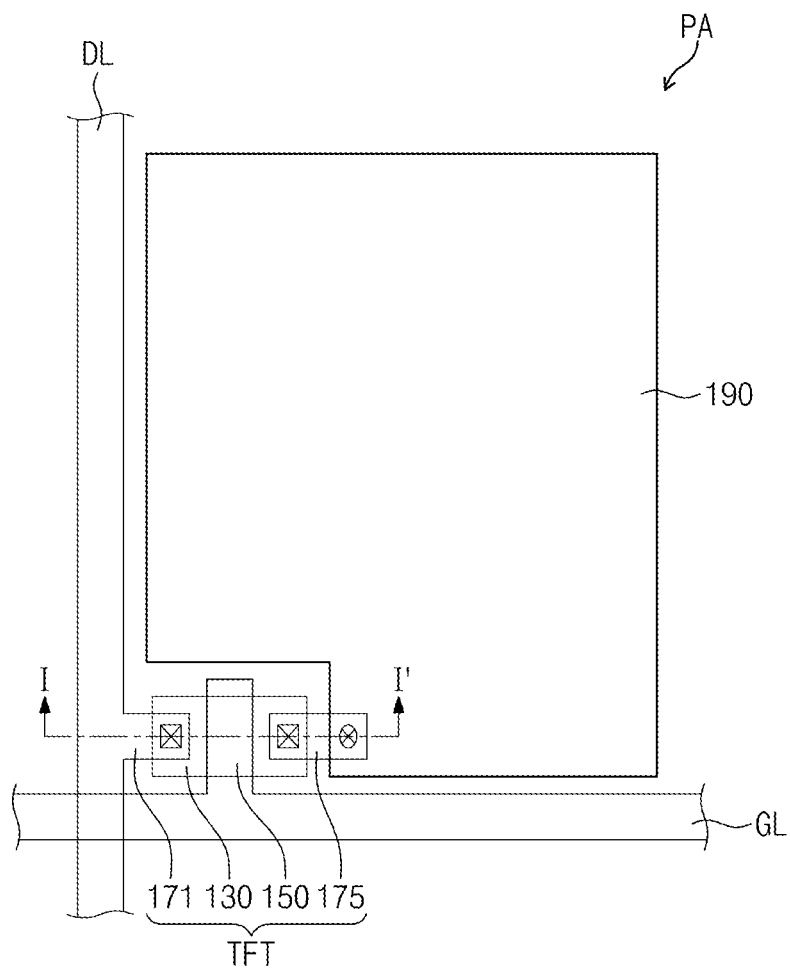
FIG. 2 is a plan view illustrating a single pixel area in an array substrate shown in FIG. 1.
Figure 3:
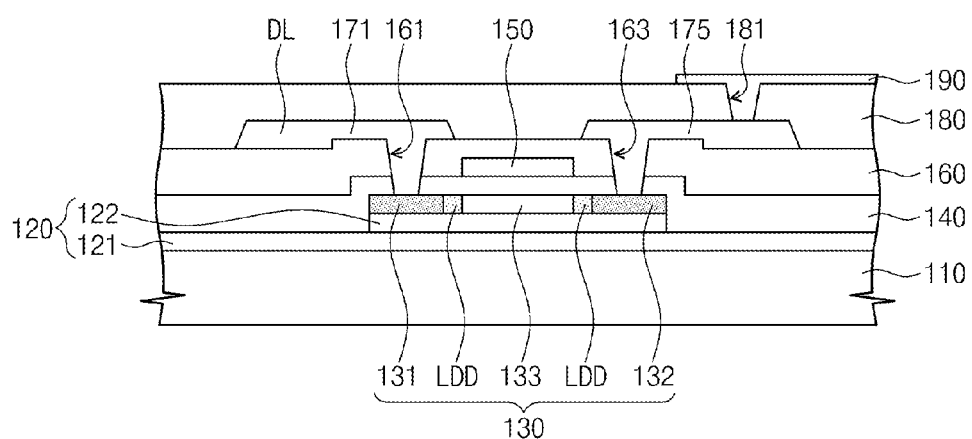
FIG. 3 is a cross-sectional view taken along line I-I' of FIG. 2.

FIG. 2 is a plan view illustrating a pixel area PA in an array substrate shown in FIG. 1, and FIG. 3 is a cross-sectional view taken along line I-I' of FIG. 2.

Referring to FIGS. 2 and 3, the array substrate 100 may be divided into a plurality of pixel areas PAs and may include a base substrate 110, a gate line GL extending in a first direction disposed on the base substrate 110, a data line DL insulated from the gate line GL and extending in a second direction crossing the first direction, a thin film transistor TFT in contact with the gate line GL and the data line DL, a light-blocking layer 120 disposed between the base substrate 110 and the thin film transistor TFT, and a pixel electrode 190 in contact with the thin film transistor TFT.

Hereinafter, the array substrate 100 will be described in more detail.

First, the base substrate 110 formed of transparent insulating material may allow light to transmit therethrough and may be a rectangular plate having a long side and a short side.

The thin film transistor TFT may include a semiconductor layer 130, a gate electrode 150, a source electrode 171, and a drain electrode 175.

The semiconductor layer 130 is disposed on the base substrate 110 and may be one of amorphous silicon (amorphous-Si), polysilicon (poly-Si), and single crystal silicon (Si). Also, the semiconductor layer 130 includes a source region 131 and a drain region 132 having an n-type impurity or p-type impurity, a channel region 133 between the source region 131 and the drain region 132, and lightly doped drain (LDD) regions between the source/drain regions 131 and 132 and the channel region 133. The source region 131 and the drain region 132 are regions having impurity concentrations higher than those of the LDD regions. The TFT having the LDD regions is less vulnerable to hot-carrier degradation and has minimized off current.

The gate electrode 150 is disposed on the semiconductor layer 130 and may be insulated from the semiconductor layer 130 by a first insulation layer 140 disposed between the semiconductor layer 130 and the gate electrode 150. Also, the gate electrode 150 may have a shape extending from the gate line GL to the inside of the pixel area PA and may be overlapped with the channel region 133.

A second insulation layer 160 covering a substantially entire surface of the base substrate 110 may be disposed on the gate electrode 150. Herein, a first contact hole 161 exposing a portion of the source region 131 of the semiconductor layer 130 and a second contact hole 163 exposing a portion of the drain region 132 may be formed in the second insulation layer 160.

The source electrode 171 and the drain electrode 175 are disposed on the second insulation layer 160. Herein, the source electrode 171 is in contact with the source region 131 through the first contact hole 161 and the drain electrode 175 is in contact with the drain region 132 through the second contact hole 163. Also, the source electrode 171 may have a shape extending from the data line DL to the inside of the pixel area PA and at least a portion of the source electrode 171 may be overlapped with the source region 131. Ohmic contact layers (not shown) may be disposed between the source region 131 and the source electrode 171 and between the drain region 132 and the drain electrode 175.

The light-blocking layer 120 may be disposed between the base substrate 110 and the thin film transistor TFT and may prevent external light from being incident into the semiconductor layer 130. In particular, the light-blocking layer 120 may prevent light supplied from the back-light unit from being incident on the channel region 133.

The light-blocking layer 120 may have a multilayer structure including different materials. For example, the light-blocking layer 120 may include a first layer 121 disposed on the base substrate 110 and a patterned second layer 122 disposed on the first layer 121. The part of the base substrate 110 that is covered by the semiconductor layer 130 is herein referred to as "the first part" of the base substrate 110. Herein, the first layer 121 may include a material having a low light transmission loss, i.e., a light transmittable material. For example, the first layer 121 may include $SiO_2$. The patterned second layer 122 may include a material able to reflect light or a material able to absorb light, that is, a material able to block light. For example, the patterned second layer 122 may include any one of $SiN_x$ (x≥1), $MoN_x$ (x≥1), $MoO_x$ (x≥1), $TiN_x$ (x≥1), and SiGe.

Also, the patterned second layer 122 may overlapped with the semiconductor layer 130 in a plane view and not overlapped with the pixel electrode 190. The reason for this is that an aperture ratio of the display device may be decreased when the light-blocking layer 120 is overlapped with the pixel electrode 190. Since the light-blocking layer 120 does not overlapped with the pixel electrode 190, the aperture ratio of the display device may not be decreased.

A third insulation layer 180 is disposed on the thin film transistor TFT and a portion of the third insulation layer 180 is removed to expose a portion of the drain electrode 175. Herein, a region of the third insulation layer 180 exposing the portion of the drain electrode may be denoted as a via hole 181. Also, the third insulation layer 180 may be formed of an organic and inorganic composite layer, the third insulation layer 180 may planarize the array substrate 100 by removing a step height generated by the thin film transistor TFT and the light-blocking layer 120.

The pixel electrode 190 may be disposed on the third insulation layer 180 and connected to the drain electrode 175 through the via hole 181. The pixel electrode 190 may be provided with the driving signal of the display device from the data line DL through the thin film transistor TFT.

Herein, the pixel electrode 190 may include a transparent conductive material. For example, the pixel electrode 190 may include any one of transparent conductive oxides of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The array substrate 100 may prevent external light from being incident on the channel region 133 of the semiconductor layer 130 by the light-blocking layer 120. In particular, non-emissive display panels, such as a liquid crystal display panel, an electrophoretic display panel, and an electrowetting display panel may prevent light provided from the back-light unit from being incident on the channel region 133 of the semiconductor layer 130 by the light-blocking layer 120. Therefore, the array substrate 100 may be prevented from a photo leakage current during off-state of the thin film transistor TFT.

Also, since the gate electrode 150 is disposed on the semiconductor layer 130 so as to be overlapped with the channel region 133, the gate electrode 150 may prevent light from the outside other than the back-light unit from being incident on the channel region 133.

FIGS. 4 through 9 are cross-sectional views illustrating a method of fabricating the array substrate shown in FIGS. 2 and 3.

Figure 4:
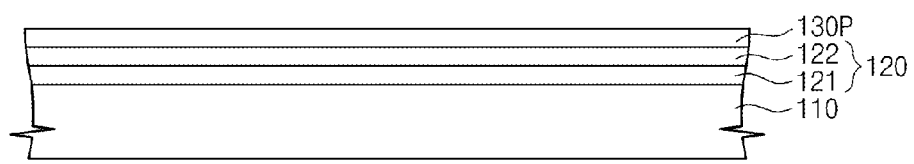
FIGS. 4 through 9 are cross-sectional views illustrating a method of fabricating the array substrate shown in FIGS. 2 and 3.

Referring to FIG. 4, a base substrate 110 is first prepared. The base substrate 110 may include a light transmittable insulating material, such as transparent glass or a transparent plastic material, and a surface thereof may be substantially planarized.

After the base substrate 110 is prepared, a light-blocking layer 120 is formed on the base substrate 110. The light-blocking layer 120 may prevent or reduce light incident on the semiconductor layer 130.

The light-blocking layer 120 may be formed by forming a first layer 121 on the base substrate 110 and a second layer 122 on the first layer 121. The first layer 121 may include a light transmittable material, that is, a material having a low light transmission loss, such as $SiO_x$ ($x \geq 1$). Also, the first layer 121 may act as a buffer layers preventing impurities from diffusing from the base substrate 110 into the semiconductor layer 130 during a high-temperature process. Further, the second layer 122 may include a material able to block light, that is, a material able to reflect light or an opaque material able to absorb light. For example, the second layer 122 may include any one of $SiN_x$ ($x \geq 1$), $MoN_x$ ($x \geq 1$), $MoO_x$ ($x \geq 1$), $TiN_x$ ($x \geq 1$), and SiGe.

The first layer 121 and the second layer 122 may be formed by using a thin film deposition method, such as a sputtering method and a chemical vapor deposition (CVD) method.

After the light-blocking layer 120 is formed, a silicon layer 130P is formed on the light-blocking layer 120. Herein, the silicon layer 130P is formed by depositing amorphous silicon on the light-blocking layer 120 by using a thin film deposition method, such as a sputtering method and a chemical vapor deposition method, and crystallizing the amorphous silicon. A dehydrogenation treatment removing a hydrogen (H) component contained in the amorphous silicon may be performed before the crystallization of the amorphous silicon. A method of the crystallization of the amorphous silicon may be one of a solid phase crystallization (SPC) method, an excimer laser crystallization (ELC) method, a sequential lateral solidification (SLS) method, a metal induced crystallization (MIC) method, and a metal induced lateral crystallization (MILC) method. The silicon layer 130P may be formed by directly depositing poly-silicon layer on the light blocking layer 120 by using a thin film deposition method.

Figure 5:
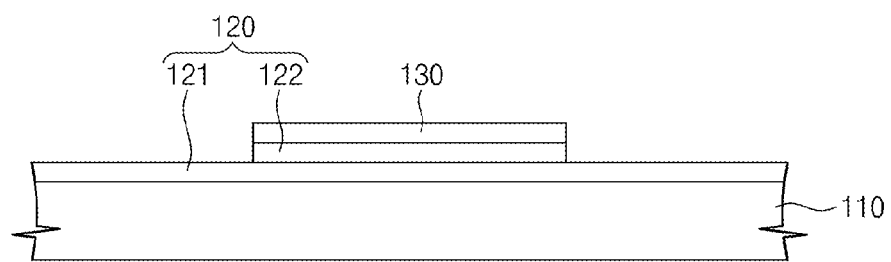

Referring to FIG. 5, after the silicon layer 130P is formed, a semiconductor layer 130 is formed by etching the silicon layer 130P. Herein, the second layer 122 may be etched after etching the silicon layer 130P. The silicon layer 130P and the second layer 122 may be patterned by using a single etch mask to form a patterned second layer 122 and the semiconductor layer 130. Therefore, the semiconductor layer 130 and the patterned second layer 122 may have the same shape in a plan view.

Figure 6:
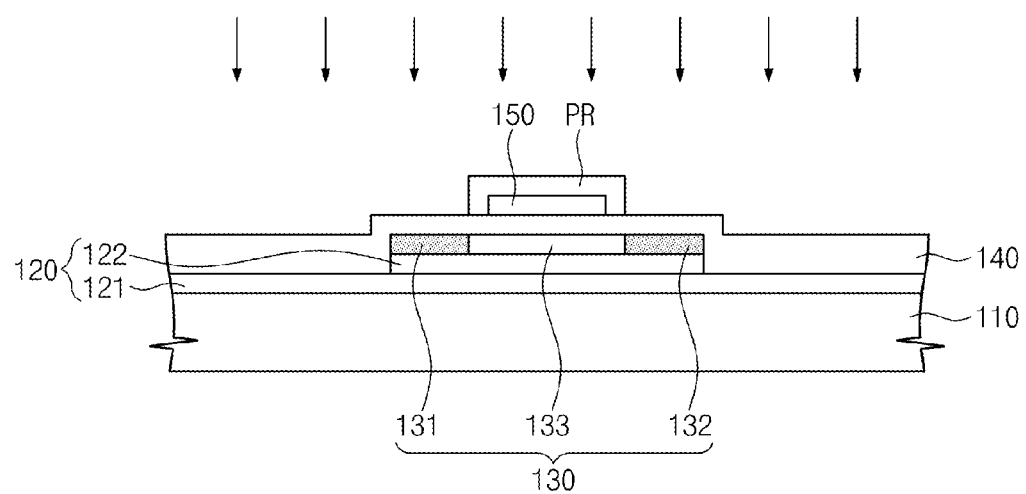

Referring to FIG. 6, after the semiconductor layer 130 is formed, a first insulation layer 140 covering the semiconductor layer 130 is formed. The first insulation layer 140 may be a gate dielectric insulating layer insulating a gate electrode 150 to be formed from the semiconductor layer 130.

After the first insulation layer 140 is formed, the gate electrode 150 and a gate line GL are formed by depositing and patterning a conductive material on the first insulation layer 140. Herein, the gate electrode 150 and the gate line GL may have a single-layer structure including any one of Cu, MoW, Al, AlNd, Mo, TiW, Ta, and Cr. Also, the gate electrode 150 and the gate line GL may have a multilayer structure, in which two or more layers of a Cu layer, a MoW layer, an Al layer, an AlNd layer, a Mo layer, a TiW layer, a Ta layer, and a Cr layer are stacked.

After the gate electrode 150 and the gate line GL are formed, a photoresist (PR) pattern covering the gate electrode 150 including both sides of the gate electrode 150 is formed.

After the photoresist pattern is formed, a source region 131 and a drain region 132 are formed in exposed areas of the semiconductor layer 130 by performing a process of implanting high-concentration impurities into the semiconductor layer 130 by using the photoresist pattern as a mask.

Herein, when the thin film transistor TFT according to the present embodiment includes an N-channel, the impurity implantation process may be a process of implanting an $N^+$ impurity. Also, when the thin film transistor TFT according to the present embodiment includes a P-channel, the impurity implantation process may be a process of implanting a $P^+$ impurity.

Figure 7:
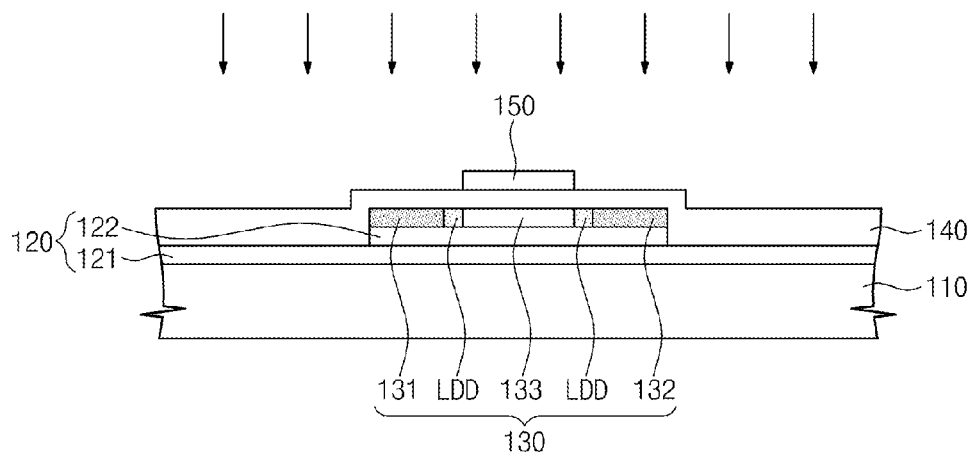

Referring to FIG. 7, after the source region 131 and the drain region 132 are formed, the photoresist pattern is removed through an ashing process. A process of implanting low-concentration impurities is performed by using the gate electrode 150 as a mask. Herein, when the thin film transistor TFT according to the present embodiment includes an N-channel, the impurity implantation process may be a process of implanting an $N^-$ impurity. Also, when the thin film transistor TFT according to the present embodiment includes a P-channel, the impurity implantation process may be a process of implanting a $P^-$ impurity.

The semiconductor layer 130 may have a structure including the source region 131, the drain region 132, a channel region 133 under the gate electrode 150, and lightly doped drain (LDD) regions between the source/drain regions 131 and 132 and the channel region 133 by using a process of implanting the low-concentration impurities.

A method of forming the LDD regions after the forming of the source region 131 and the drain region 132 having high-concentration impurity regions is described as an example in the present embodiment. The present embodiment is not limited thereto. For example, low-concentration impurities are implanted by using the gate electrode 150 as a mask and the photoresist pattern is then formed. Thereafter, the source region 131 and the drain region 132 may be formed by implanting high-concentration impurities by using the photoresist pattern as a mask.

When the thin film transistors TFTs according to the present embodiment includes both the N-channel TFT and the P-channel TFT, the process of forming photoresist pattern and implanting the N+ impurity, P+ impurity and LDD may be performed separately.

Figure 8:
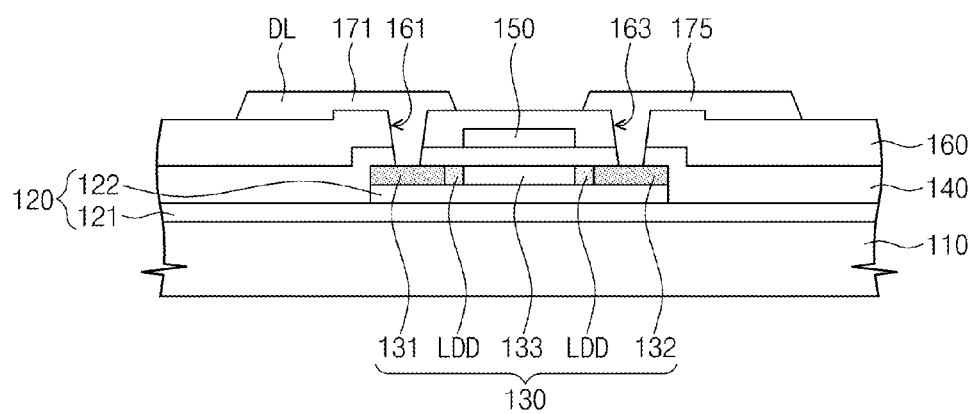

Referring to FIG. 8, after the low-concentration impurities are implanted, a second insulation layer 160 covering the gate electrode 150 is formed. The second insulation layer 160 is formed on the first insulation layer 140 and the gate electrode 150. Therefore, the second insulation layer 160 insulates the gate electrode 150 from a source electrode 171 and a drain electrode 175 to be formed later.

After the second insulation layer 160 is formed, first and second contact holes 161 and 163 exposing each respective portion of the source region 131 and the drain region 132 are formed by patterning the second insulation layer 160.

After the first and second contact holes 161 and 163 are formed, a data line DL, the source electrode 171, and the drain electrode 175 is formed on the second insulation layer 160. The data line DL, the source electrode 171, and the drain electrode 175 are formed by depositing and patterning a conductive material on the second insulation layer 160. Herein, the source electrode 171 is in contact with the source region 131 through the first contact hole 161 exposing the source region 131. The drain electrode 175 is in contact with the drain region 132 through the second contact hole 163 exposing the drain region 132.

The data line DL, the source electrode 171, and the drain electrode 175 may include the same material as that of the gate line GL and the gate electrode 150.

Figure 9:
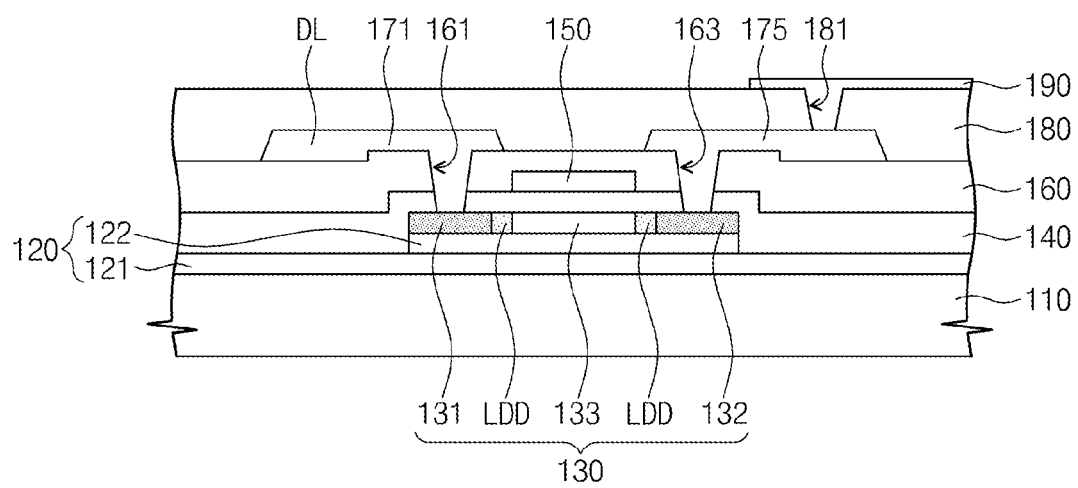

Referring to FIG. 9, after the thin film transistor TFT is formed, a third insulation layer 180 covering the thin film transistor TFT and able to protect the thin film transistor TFT from an outside environment is formed. The third insulation layer 180 may be formed by depositing an inorganic insulating material or organic insulating material on the second insulation layer 160 having the data line DL, the source electrode 171, and the drain electrode 175 formed thereon. Also, the third insulation layer 180 may have a multilayer structure, in which an inorganic insulating material layer and an organic insulating material layer are stacked.

After the third insulation layer 180 is formed, a via hole 181 exposing a portion of the drain electrode 175 is formed by patterning the third insulation layer 180.

After the via hole 181 is formed, a conductive material is deposited on an entire surface of the base substrate 110 and patterned to form a pixel electrode 190 in contact with the drain electrode 175. Herein, the pixel electrode 190 may include any one of transparent conductive oxides of indium tin oxide (ITO), indium zinc oxide (IZO), indium tin zinc oxide (ITZO), aluminum zinc oxide (AZO), gallium doped zinc oxide (GZO), zinc tin oxide (ZTO), gallium tin oxide (GTO), and fluorine doped tin oxide (FTO).

Figure 10:
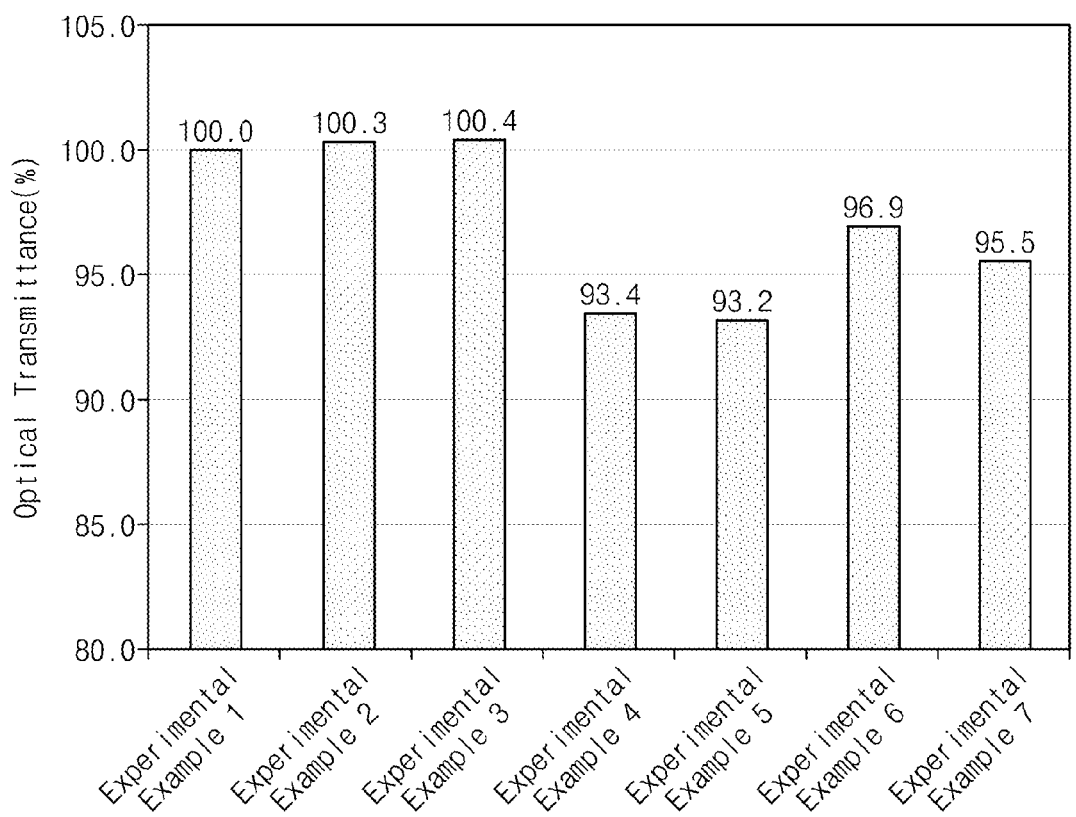
FIG. 10 is a graph showing optical transmittances measured according to a glass substrate and layer structures formed on the glass substrate.
Figure 11:
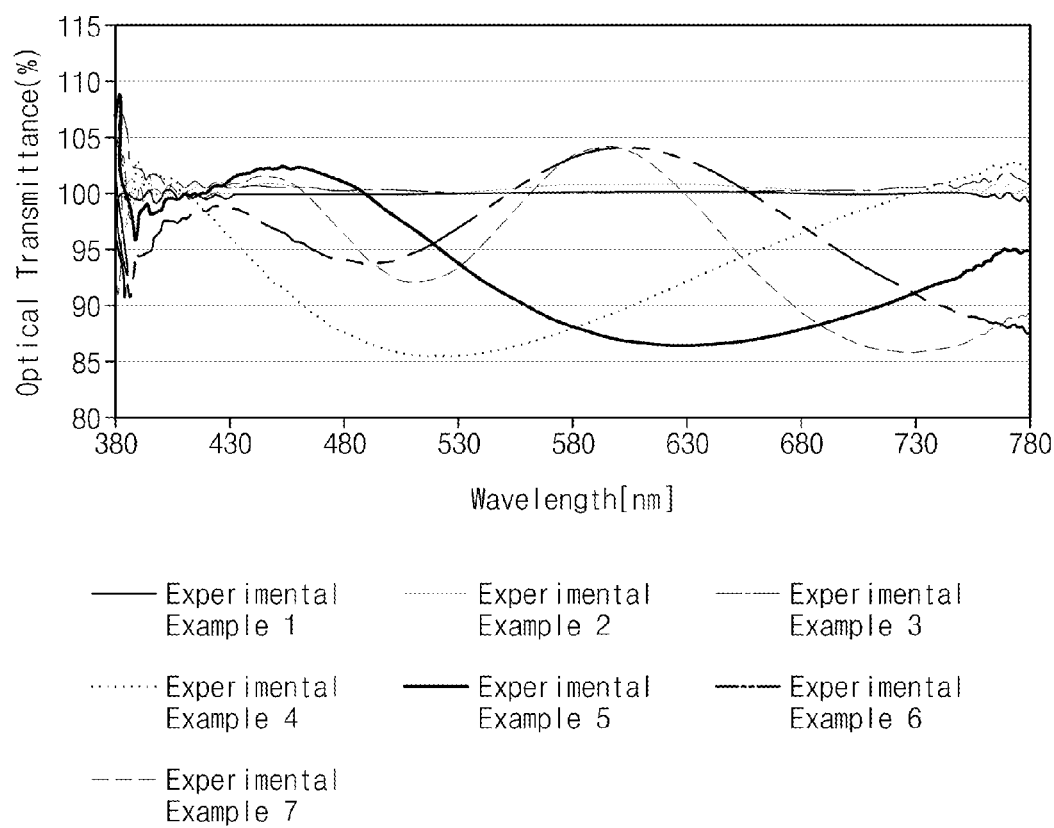
FIG. 11 is a graph showing optical transmittances for each wavelength of Experimental Examples 1 to 7 in FIG. 10.

FIG. 10 is a graph showing optical transmittances measured according to a glass substrate and layer structures formed on the glass substrate, FIG. 11 is a graph showing optical transmittances for each wavelength of Experimental Examples 1 to 7 in FIG. 10, and Table 1 describes configurations and transmittances of Experimental Examples 1 to 7 in FIG. 10.

TABLE 1

Configurations and transmittances of Experimental Examples 1 to 7

| | Configuration | Transmittance (%) |
|---|---|---|
| Experimental Example 1 | 0.5 mm glass substrate | 100 |
| Experimental Example 2 | 0.5 mm glass substrate 5000 Å SiO$_2$ material layer | 100.3 |
| Experimental Example 3 | 0.5 mm glass substrate 2000 Å SiO$_2$ material layer | 100.4 |
| Experimental Example 4 | 0.5 mm glass substrate 500 Å SiN material layer 2000 Å SiO$_2$ material layer | 93.4 |
| Experimental Example 5 | 0.5 mm glass substrate 1000 Å SiN material layer 2000 Å SiO$_2$ material layer | 93.2 |
| Experimental Example 6 | 0.5 mm glass substrate 1000 Å SiN material layer 3000 Å SiO$_2$ material layer | 96.9 |
| Experimental Example 7 | 0.5 mm glass substrate 1000 Å SiN material layer 5000 Å SiO$_2$ material layer | 95.5 |

Referring to FIGS. 10 and 11, and Table 1, an about 0.5 mm thick glass substrate was irradiated with light to measure an optical transmittance in Experimental Example 1 and the optical transmittance of Experimental Example 1 was assumed to be 100%.

In Experimental Examples 2 and 3, samples respectively including about 5000 Å and about 2000 Å thick SiO$_2$ material layers on about 0.5 mm thick glass substrates were irradiated with light to measure optical transmittances, and it may be understood that the optical transmittances thereof were substantially the same as that of Experimental Example 1.

In Experimental Examples 4 to 7, samples including a SiO$_2$ material layer and a SiN material layer on a glass substrate were irradiated with light to measure optical transmittances, and it may be understood that each optical transmittance was lower than that of Experimental Example 1. The reason for this is that the SiN material layer absorbed some of the incident light. That is, it may be understood that there was a light-blocking effect when the sample included a material able to absorb the incident light, such as the SiN material layer. In particular, with respect to Experimental Examples 4 and 5 respectively having about 500 Å and about 1000 Å thick SiN material layers, it may be understood that optical transmittances were decreased in an overall wavelength range of visible light.

Also, as in the case of including the material absorbing light, it may possibly be inferred that there may be a light-blocking effect when the sample includes a material able to reflect light.

Figure 12:
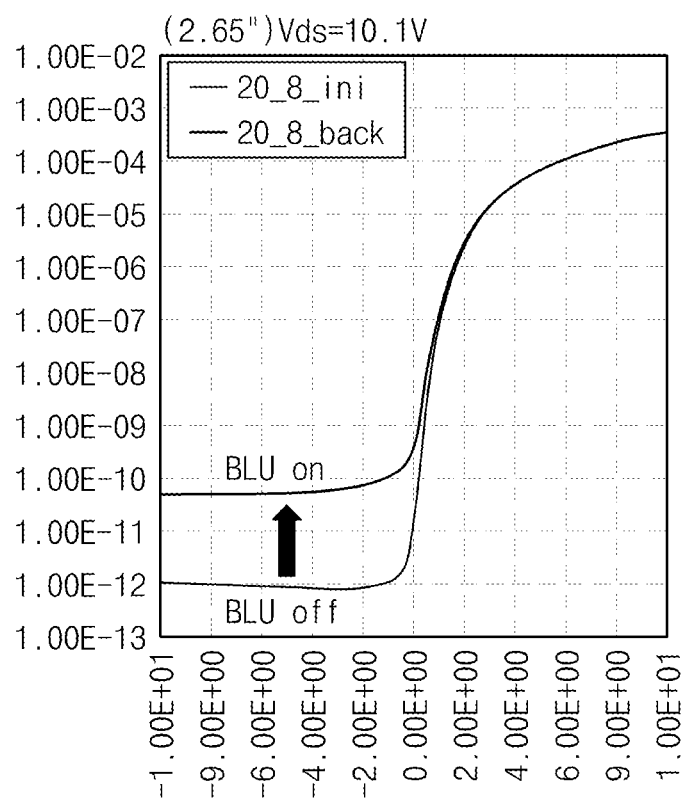
FIG. 12 is a graph showing current-voltage characteristics of a thin film transistor when the array substrate does not include a light-blocking layer.
Figure 13:
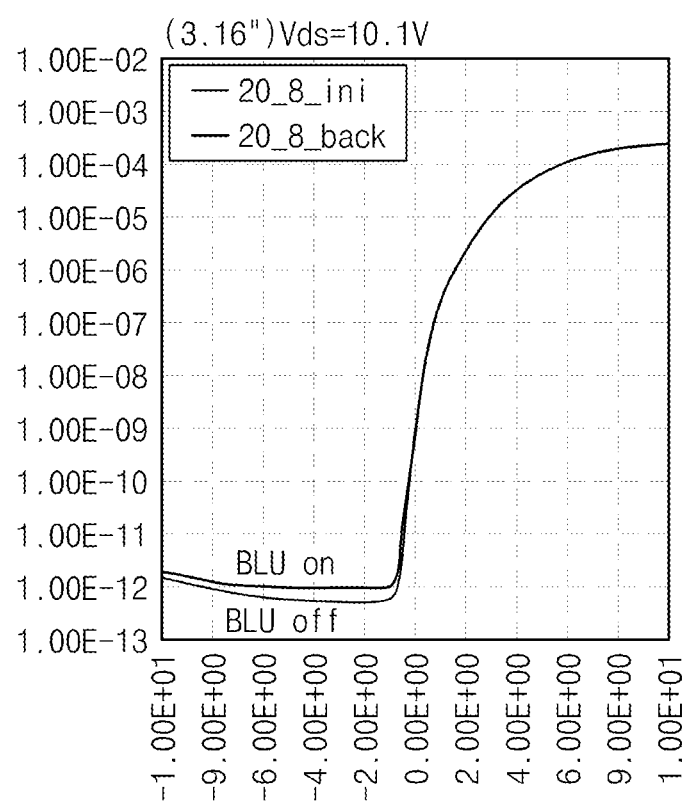
FIG. 13 is a graph showing current-voltage characteristics of a thin film transistor when the array substrate includes a light-blocking layer.

FIG. 12 is a graph showing current-voltage characteristic of a thin film transistor when the array substrate does not include a light-blocking layer and FIG. 13 is a graph showing current-voltage characteristics of a thin film transistor when the array substrate includes a light-blocking layer. In FIG. 13, the light-blocking layer may absorb or reflect about 100% of incident light.

Referring to FIGS. 12 and 13, it may be understood that on-currents of the thin film transistors may not be changed regardless of presence of a light-blocking layer and on/off of a back-light unit, when power is supplied to the thin film transistors.

However, it may be understood that off-currents of the thin film transistor measured according to the on/off of the back-light unit are different, when the light-blocking layer is not included under the semiconductor layer of the thin film transistor.

More particularly, it may be understood that the thin film transistor does not generate photo leakage current because the off-current of the thin film transistor is about $1.00\times10^{-12}$ A or less when the back-light is turned off.

However, the off-current of the thin film transistor is between about $1.00\times10^{-11}$ A and about $1.00\times10^{-10}$ A when the back-light is turned on. The off-current when the back-light is turned on is higher than the off-current when the back-light is turned off. The reason for this is that the light provided from the back-light unit is incident into the channel region of the thin film transistor and generate a photo leakage current.

Therefore, it may be understood that current characteristics of the thin film transistor when light is turn on are degraded when the light-blocking layer is not included under the thin film transistor.

On the other hand, it may be understood that currents measured according to the on/off of the back-light unit are almost similar to each other when the light-blocking layer is included under the semiconductor layer of the thin film transistor. That is, the light-blocking layer may prevent a photo leakage current of the thin film transistor by blocking the light from back light unit incident on the channel region of the semiconductor layer.

Therefore, it may be understood that current-voltage characteristics of the thin film transistor are almost same regardless of the back light when the light-blocking layer is included under the thin film transistor.

Figure 14:
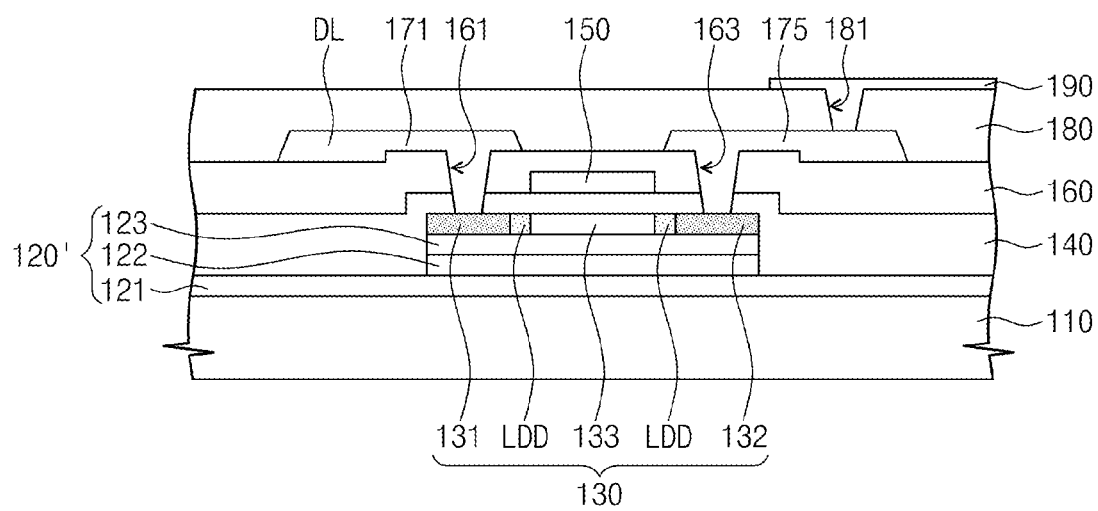
FIG. 14 is a cross-sectional view illustrating an array substrate according to another embodiment of the inventive concept.

Hereinafter, another embodiment of the inventive concept will be described with reference to FIG. 14. In FIG. 14, the same reference numerals are provided for the same elements as those shown in FIGS. 1 through 9 and the detailed descriptions thereof will be omitted. Also, in FIG. 14, points different from those of FIGS. 1 through 9 will be mainly described so as to avoid overlapping descriptions.

FIG. 14 is a cross-sectional view illustrating an array substrate according to another embodiment of the inventive concept.

Referring to FIG. 14, an array substrate 100 includes a base substrate 110, a thin film transistor TFT disposed on the base substrate 110, a light-blocking layer 120' disposed between the base substrate 110 and the thin film transistor TFT, and a pixel electrode 190 in contact with the thin film transistor TFT.

Herein, the thin film transistor TFT includes a semiconductor layer 130, a gate electrode 150, a source electrode 171, and a drain electrode 175. The semiconductor layer 130 includes a channel region 133 overlapped with the gate electrode 150, a source region 131 and a drain region 132 at both sides of the channel region 133, lightly doped drain (LDD) regions between the source region 131 and drain region 132 and the channel region 133. Also, the source region 131 and the drain region 132 are in contact with the source electrode 171 and the drain electrode 175, respectively. The drain electrode 175 is in contact with the pixel electrode 190.

The light-blocking layer 120' may include a first layer 121 including a light transmittable material, a second layer 122 disposed on the first layer 121 and including a material able to block light, and a third layer 123 disposed between the second layer 122 and the thin film transistor TFT.

The second layer 122 and the third layer 123 may have a shape superposed with the channel region 133 in a plan view.

The third layer 123 may include a light transmittable material, e.g., the same material as that of the first layer 121. Also, the third layer 123 may include a material able to block light, e.g., the same material as that of the second layer 122. Herein, a light-blocking efficiency of the light-blocking layer 120' may be improved when the third layer 123 includes the same material as that of the second layer 122.

The array substrate 100 including the light-blocking layer 120' may be fabricated through the following processes.

First, the first layer 121, the second layer 122, and the third layer 123 are sequentially formed on the base substrate 110.

Next, amorphous silicon is deposited on the third layer 123 and the amorphous silicon is crystallized, and then the semiconductor layer is formed by patterning the crystallized silicon. The silicon layer may be formed by directly depositing poly-silicon layer on the third layer 123 by using a thin film deposition method, and then the semiconductor layer is formed by patterning the crystallized silicon. Herein, the semiconductor layer 130, the second layer 122, and the third layer 123 may be patterned by using a single mask. Therefore, the semiconductor layer 130, the second layer 122, and the third layer 123 may have a same shape in a plan view.

Thereafter, the array substrate 100 according to the present embodiment may be fabricated by performing the processes as shown in FIGS. 6 through 9.

An array substrate of the present disclosure includes a light-blocking layer able to block external light incident on a thin film transistor. Therefore, a photo leakage current being generated in the thin film transistor by the external light may be prevented.

Also, a method of fabricating an array substrate of the present disclosure does not require an additional mask, because the light-blocking layer may be patterned simultaneously with fabrication of a thin film transistor. Therefore, an increase in manufacturing costs of the array substrate may be prevented.

The above detailed description exemplifies and explains the present invention. Also, the foregoing description is merely provided to present and describe preferred embodiments of the present invention. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An array substrate comprising:
   a base substrate;
   a thin film transistor including a semiconductor layer disposed on the base substrate, a source electrode and a drain electrode, the source electrode and the drain electrode electrically connected to the semiconductor layer, and a gate electrode disposed on the semiconductor layer and insulated from the semiconductor layer;
   a first layer disposed between the base substrate and the semiconductor layer, the first layer covering an entire surface of the base substrate and transmitting light; and
   a second layer disposed between the first layer and the semiconductor layer, and the second layer blocking the light, and
   wherein the second layer being disposed close to the semiconductor layer than the first layer, and wherein the second layer self-aligned with the semiconductor and the second layer has substantially the same shape as the semiconductor layer in a plan view.

2. The array substrate of claim 1, wherein the first layer comprises $SiO_2$.

3. The array substrate of claim 2, wherein the second layer comprises any one of $SiN_x$ (x≥1), $MoN_x$ (x≥1), $MoO_x$ (x≥1), $TiN_x$ (x≥1), and SiGe.

4. The array substrate of claim 3, further comprising a third layer disposed between the second layer and the semiconductor layer,
wherein the third layer self-aligned by with the semiconductor layer and the third layer has substantially the same shape as the semiconductor layer in a plan view.

5. The array substrate of claim 4, wherein the third layer comprises the same material as that of one of the first layer and the second layer.

6. The array substrate of claim 4, wherein the semiconductor layer comprises:
a channel region overlapping with the gate electrode in a plan view;
a source region and a drain region at both sides of the channel region; and
lightly doped drain regions between the channel region and the source region and the drain region.

7. The array substrate of claim 6, further comprising a first insulation layer disposed between the semiconductor layer and the gate electrode,
wherein the first insulation layer covers an upper surface of the first layer, side surfaces of the second layer and the third layer.

8. The array substrate of claim 7, further comprising a second insulation layer disposed between the gate electrode and the source and drain electrodes,
wherein contact holes expose each respective portion of the source region and the drain region, and the contact holes are defined in the first insulation layer and the second insulation layer, and
wherein the second insulation layer covers an upper surface of the first insulation layer.

9. The array substrate of claim 8, further comprising:
a third insulation layer covering the source electrode and the drain electrode and including a via hole exposing a portion of the drain electrode; and
a pixel electrode in contact with the drain electrode through the via hole,
wherein the first insulation layer, the second insulation layer, and the third insulation layer is disposed between the first layer and the pixel electrode.

10. The array substrate of claim 9, wherein the second layer is not overlapped with the pixel electrode in a plan view.

* * * * *